(12) United States Patent
Deininger et al.

(10) Patent No.: US 8,022,796 B2
(45) Date of Patent: Sep. 20, 2011

(54) CONTACTLESS SWITCH

(75) Inventors: Jochen Deininger, Kisslegg (DE); Martin Reinwald, Salem/Weildorf (DE)

(73) Assignee: Conti Temic microelectronic GmbH, Nuremberg (DE)

( * ) Notice: Subject to any disclaimer, the term of this patent is extended or adjusted under 35 U.S.C. 154(b) by 162 days.

(21) Appl. No.: 12/309,840

(22) PCT Filed: Jul. 24, 2007

(86) PCT No.: PCT/DE2007/001313
§ 371 (c)(1),
(2), (4) Date: Jan. 30, 2009

(87) PCT Pub. No.: WO2008/014757
PCT Pub. Date: Feb. 7, 2008

(65) Prior Publication Data
US 2009/0195338 A1    Aug. 6, 2009

(30) Foreign Application Priority Data

Jul. 31, 2006 (DE) .......................... 10 2006 035 514
Nov. 18, 2006 (DE) .......................... 10 2006 054 412

(51) Int. Cl.
*H01H 9/00* (2006.01)
(52) U.S. Cl. ........................ 335/205; 335/207; 307/10.3

(58) Field of Classification Search .......... 335/205–207; 307/10.3–10.6; 70/276
See application file for complete search history.

(56) References Cited

U.S. PATENT DOCUMENTS

| | | | |
|---|---|---|---|
| 5,065,604 A | 11/1991 | Pattock | |
| 6,201,317 B1 | 3/2001 | Kemmann et al. | |
| 6,236,121 B1 | 5/2001 | Kemmann et al. | |
| 6,538,557 B1 * | 3/2003 | Giessl | 340/5.2 |
| 2006/0089784 A1 * | 4/2006 | Spicer et al. | 701/115 |

FOREIGN PATENT DOCUMENTS

| | | |
|---|---|---|
| DE | 295 10 696 | 8/1995 |
| DE | 197 47 720 | 5/1998 |
| DE | 198 21 899 | 12/1999 |
| DE | 199 38 888 | 4/2001 |
| DE | 100 30 886 | 2/2002 |
| DE | 103 49 937 | 6/2005 |
| FR | 2 797 724 | 2/2001 |

* cited by examiner

*Primary Examiner* — Ramon Barrera
(74) *Attorney, Agent, or Firm* — W. F. Fasse; W. G. Fasse

(57) ABSTRACT

A contactless switch includes an angularly and/or axially adjustable rotor, by which at least one main magnet is directly or indirectly adjustable. The magnetic field of the at least one main magnet influences at least two magnetic field sensors, which issue signals that correlate with a magnetic field strength of the magnetic field, and/or an alteration in the magnetic field strength and/or a polarization of the magnetic field.

19 Claims, 4 Drawing Sheets

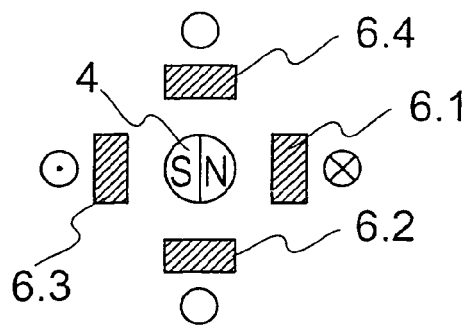 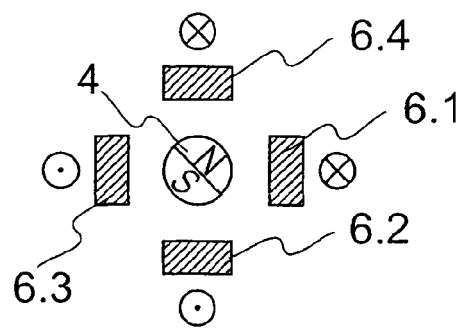
Fig. 4a                Fig. 4b
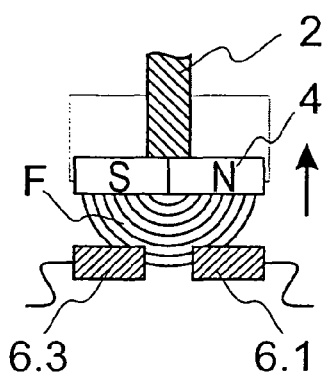 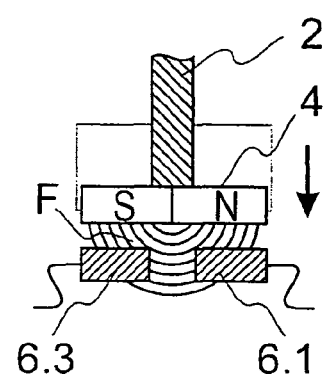
Fig. 5a                Fig. 5b
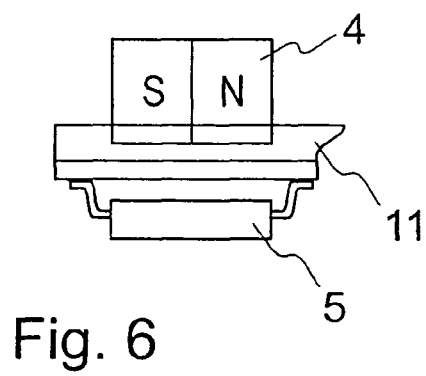
Fig. 6

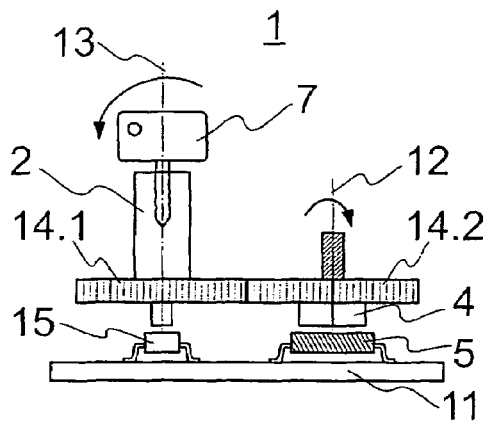
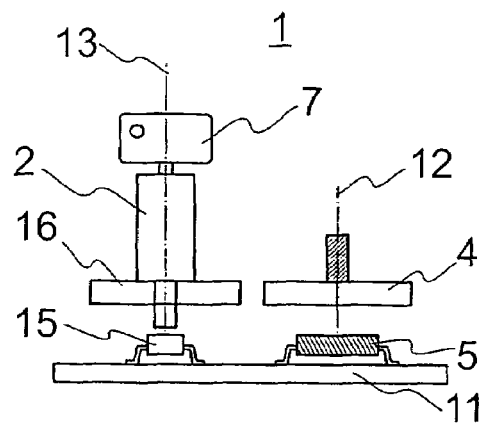
Fig. 7a   Fig. 8a
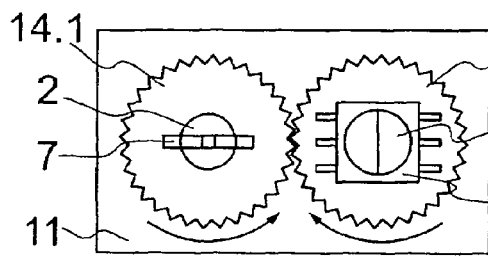
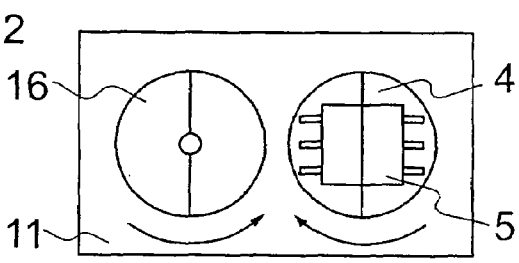
Fig. 7b   Fig. 8b
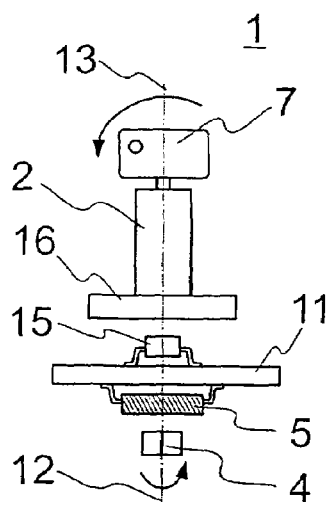
Fig. 9
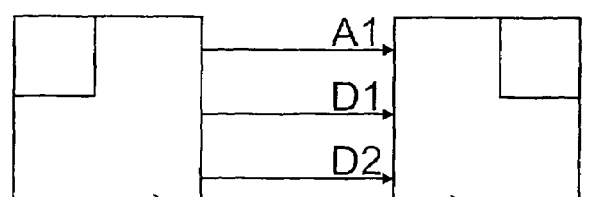
Fig. 10

CONTACTLESS SWITCH

FIELD OF THE INVENTION

The invention relates to a contactless switch, in particular a rotary switch, for use as an electronic ignition key.

BACKGROUND INFORMATION

Standard switches with contacts, such as ignition locks in automobiles, are subject to wear on their contacts when used frequently, due to friction, elastic deformation, current flow and break sparks. Ignition locks generally comprise devices which detect whether an ignition key has been inserted or removed. This detection is usually made mechanically and leads to a blockage of the steering or a removal of this blockage. With regard to electronic systems present in modern automobiles, an improved drive authorisation control and the drive-by-wire systems which can be anticipated in the future, in which a mechanical steering may be omitted, it is desirable that the detection as to whether the key has been inserted or removed be conducted electronically and also without contacts.

SUMMARY OF THE INVENTION

The object of the invention is therefore to provide a contactless switch that can electronically detect the insertion of a proper key, and that can avoid the abovementioned disadvantages.

The above object has been achieved according to the invention by a contactless switch comprising:
a) an angularly and/or axially adjustable rotor with a key retention device at a first axial end of the rotor, wherein the rotor is rotatable around a rotational axis,
b) at least two magnetic field sensors,
c) at least one main magnet which is rotatable around an auxiliary axis, wherein the at least one main magnet is arranged so that a magnetic field of the at least one main magnet influences the at least two magnetic field sensors, and wherein, due to the influencing by the magnetic field, the magnetic field sensors are adapted to issue signals which correlate with a magnetic field strength of the magnetic field and/or a change of the magnetic field strength and/or a polarization of the magnetic field,
d) an infrared transceiver arranged centered on the rotational axis and adjacent to a second axial end of the rotor opposite the first axial end, and
e) a connecting element comprising at least one gear and/or at least one auxiliary magnet between the rotor and the main magnet, wherein the contactless switch is adapted to displace the main magnet by the rotor using the connecting element.

A contactless switch according to the invention comprises an angularly and/or axially adjustable rotor, by means of which at least one main magnet is directly or indirectly adjustable, the magnetic field of which influences at least two magnetic field sensors, by means of which signals can be emitted which correlate with a magnetic field strength of the magnetic field and/or as change to the magnetic field strength and/or a polarisation of the magnetic field. Due to the omission of electronic contacts, the occurrence of abrasion which they entail is avoided. In particular, the rotor can be adjusted angularly and axially, i.e. it can be rotated and moved in the direction of a rotational axis. When the magnetic field sensors are arranged advantageously, a position of the rotor can be determined axially and angularly with the same magnetic field sensors, whereby their signals are evaluated by a suitable evaluation device. This evaluation device can then also execute the actual switching functions by means of suitable construction elements, such as transistors.

Preferably, the contactless switch can be activated by means of a key. For this purpose, the rotor is designed in such a manner that it can hold the key. A contactless switch which is designed in this manner can for example be used as an ignition lock, with which it is possible to determine on the basis of the axial position of the rotor whether a key has been inserted or removed, and with which the angular position determines which terminals (for example, position 0, terminal 15, 15R, 50) are to be supplied with voltage.

The magnetic field sensors are preferably designed as Hall sensors. Hall sensors make use of the effect named after Edwin Hall. A Hall sensor through which a current flows supplies a voltage which is proportionate to the product of the current strength and magnetic field strength of a magnetic field which runs vertically to the current flow, so that with a known current strength, the magnetic field strength can be determined to a relatively high degree of precision. Taking into account the magnetic field strength measured by the several Hall sensors of the same main magnet, this permits a sufficiently precise determination of the position of the rotor. Due to their broad availability, Hall sensors can be purchased at a low cost, in particular in the form of several Hall sensors which are integrated into an integrated circuit. In this case, the signals from the combined measured values of the magnetic field strength can be combined with several magnetic field or Hall sensors.

The signals can be issued continuously and/or discretely in time and/or value. Discreet signals which can be issued with a pulse width code and/or serially, and/or parallel, for example, can be processed by an evaluation unit more efficiently than continuous signals, although compared with these, they restrict the precision of the determination of the position. Where appropriate, a combination of several continuous and/or discreet variants of the manner in which the signals are issued offers due to the redundancy which occurs as a result a possibility for the evaluation device to detect faults in the contactless switch (magnetic interference fields, breaking up of a magnet), or to check the plausibility of the received signals. In order to issue the signals discreetly, corresponding quantisation and/or encoding devices are required in the magnetic field sensors or in the integrated circuits which contain them.

A microprocessor can preferably be used as an evaluation device. Microprocessors are available at a low cost in a plurality for a wide range of different applications. Some models have analogue/digital converter inputs, enabling them to execute the evaluation of continuous signals without additional hardware.

In a preferred embodiment, four magnetic field sensors are provided which are arranged at an offset of 90° to each other on the circumference of an imaginary circle. A main magnet, which is rotatable around a rotational axis, and which is designed as a round magnet or ring magnet with diametrically polarised magnetic field, in which the rotational axis cuts approximately in the normal direction of the imaginary circle the surface of said circle in the area of its centre point, enables with magnetic fields which are arranged in this manner a determination of eight different angular positions of the main magnet, and thus of the rotor, even when only the polarity of the magnetic field is determined in each of the magnetic field sensors, and the magnetic field strength is disregarded. A significantly more precise determination of the position becomes possible when the magnetic field strength is taken into account. The use of a ring magnet enables infrared communication between the key and an infrared transceiver in the direction of the rotational axis, for example.

The evaluation of the magnetic field strength furthermore enables a determination of the axial position of the rotor when as a result of a change to these axial positions, a change to the distance of the main magnet to the magnetic field sensors is effected. Without a change to the polarity, the magnetic field strength here declines with increasing intervals.

In a further embodiment, the rotor is arranged coaxially in an auxiliary rotor, or the auxiliary rotor is arranged coaxially in the rotor. The rotor and the auxiliary rotor are angularly and/or axially adjustable relative to the magnetic field sensors and relative to each other. The rotor and the auxiliary rotor comprise a thread or a connecting member which interlock with each other, with which an axial adjustment of the rotor effects an angular adjustment of the auxiliary rotor. The auxiliary rotor then serves as a connecting element for the indirect connection of the main magnet to the rotor. In this manner, an axial adjustment of the rotor, for example as a result of an inserted or removed key, effects a rotation of the main magnet. With a contactless switch such as an ignition lock, in which the possible angular positions are restricted by stops, and the number of angular positions to be differentiated is low, this embodiment is a particularly simple and practical solution in mechanical terms.

In a further embodiment, the main magnet is rotatably supported around a rotational axis of the rotor or of the auxiliary rotor, or around an auxiliary axis. The magnetic field sensors are arranged on a printed circuit board, facing towards or away from the main magnet. With the arrangement facing towards the main magnet, a magnet with a relatively low magnetic field strength is sufficient. If the magnetic field sensors are positioned on the side of the printed circuit board which faces away from the main magnet, for example for reasons of space, the main magnet requires an increased magnetic field strength in order to penetrate the printed circuit board. Furthermore, for reasons of space, it may be necessary to arrange the main magnet rotatably around an auxiliary axis to the side of the rotor, rather than directly on it.

In this case in particular, a gear and/or an auxiliary magnet is or are used as a further connection element, which creates the connection between the main magnet and the rotor or auxiliary rotor. Here, the term gear refers to any type of mechanical connection which is suitable for the transmission of rotation and/or translation movements, in the simplest case, two cog wheels which comb each other, one of which is arranged on the rotational axis, and the other of which is arranged on the auxiliary axis. An auxiliary magnet can also be provided on the rotational axis, which, being also diametrically polarised, effects the rotation of the main magnet around the auxiliary axis which is parallel to or in alignment with the rotational axis.

In a further embodiment, the magnetic field sensors are facing the main magnet, which is attached to the auxiliary axis. The main magnet is moved by the auxiliary magnets, which are rotatable around the rotational axis, wherein the rotational axis and the auxiliary axis are in alignment with each other, and the printed circuit board with the magnetic field sensors lies between the main magnet and the auxiliary magnet. For this purpose, a low-friction support for the main magnet or auxiliary axis is to be provided.

BRIEF DESCRIPTION OF THE DRAWINGS

Exemplary embodiments of the invention will be explained in greater detail below with reference to a drawing, in which:

FIG. 4 shows a schematic top view of four magnetic field sensors and a main magnet in two different angular positions FIG. 5 shows a schematic side cross-section view of the arrangement from FIG. 4 with the main magnet in two different axial positions FIG. 6 shows a schematic side view of an integrated circuit with magnetic field sensors, which is arranged on the side on a printed circuit board which faces away from the main magnet FIG. 7 shows two schematic views of a contactless switch, with which the main magnet which is arranged parallel to a rotational axis of the rotor is driven with the aid of two cog wheels FIG. 8 shows two schematic views of a contactless switch, with which the main magnet which is arranged parallel to the rotational axis of the rotor is driven with the aid of an auxiliary magnet FIG. 9 shows a schematic side view of a contactless switch, with which the main magnet which is arranged on an auxiliary axis in alignment with the rotational axis of he rotor is driven with the aid of an auxiliary magnet FIG. 10 shows a block diagram of a signal transmission between the integrated circuit and a microprocessor with wake-up function

DETAILED DESCRIPTION OF EXAMPLE EMBODIMENTS OF THE INVENTION

Figure 1:
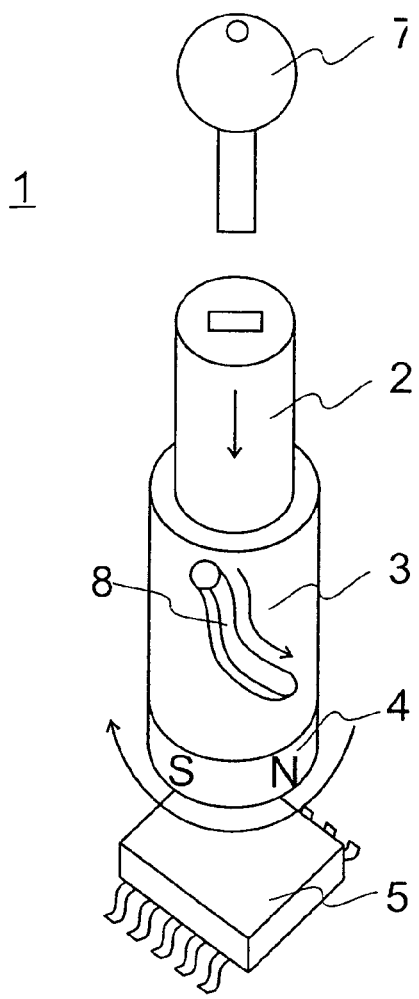
FIG. 1 shows a perspective view of a contactless switch with a rotor, an auxiliary rotor, a main magnet and an integrated circuit with magnetic field sensors

Parts which correspond to each other are assigned the same reference numerals in all figures.

FIG. 1 shows a perspective view of a contactless switch 1 with a rotor 2, an auxiliary rotor 3, a main magnet 4 and an integrated circuit 5 with magnetic field sensors 6 (not shown here). The main magnet 4 is designed as a round magnet with diametric polarisation. The round magnet has a cylindrical form. The poles N, S of the magnetic field F lie opposite each other on a cylindrical mantle surface of the main magnet 4. The integrated circuit 5 contains several magnetic field sensors 6 for detecting this magnetic field F, as is shown in detail in the following figures. The contactless switch 1 shown can be operated with a key 7 which can be inserted into the rotor 2. As a result, an axial movement of the rotor 2 is effected. The rotor 2 which is arranged coaxially in the auxiliary rotor 3 is connected with said auxiliary rotor via a connecting member 8, which causes the axial movement of the rotor 2 to be converted into an angular movement of the auxiliary rotor 3 which, like the rotor 2, is rotatably supported. As a result, the main magnet 4 which is also arranged on the auxiliary rotor 3 in the example shown here, also rotates; a fact which can be detected by the integrated circuit 5. In the same manner, an altered angular position of the rotor 2 caused by the rotation of the key 7 can be detected. In order to enable a differentiation between angular and axial position alterations, mechanical indentations can be provided which only permit certain angular positions. The contactless switch 1 shown can also be realised without a key 7 with another type of actuation. It is suitable as an ignition lock, for example, or as a light switch, or as a switch to record a steering angle or regulate an air conditioning system, if appropriate, also without axial position recording. The auxiliary rotor 3 can alternatively be arranged coaxially in the rotor 2.

Figure 2:
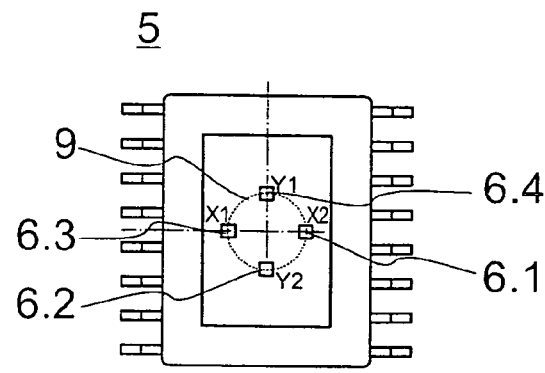
FIG. 2 shows an integrated circuit with four magnetic field sensors

FIG. 2 shows the integrated circuit 5 with four magnetic field sensors 6.1 to 6.4 which are arranged on the circumference of an imaginary circle 9. The magnetic field sensors 6.1 to 6.4 are designed as Hall sensors.

Figure 3A:
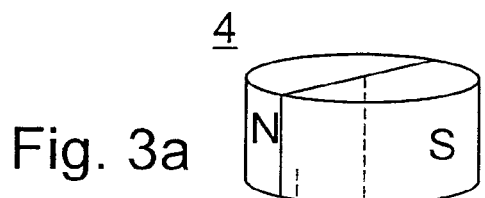
FIG. 3 shows a representation of a distribution of the magnetic field of a round magnet
Figure 3B:
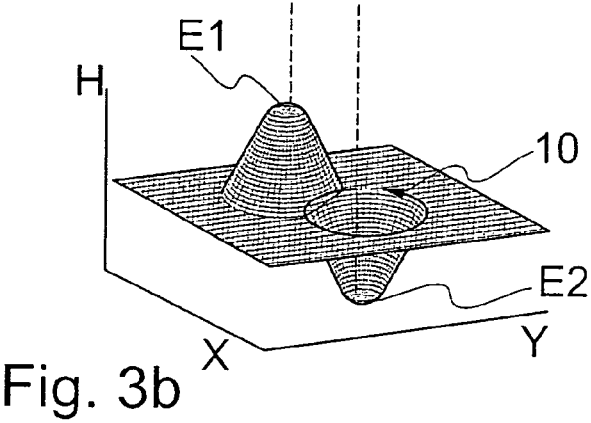
Figure 3C:
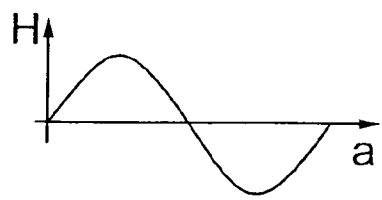

FIGS. 3a to c clarify the distribution of the magnetic field F of the main magnet 4 which is shown in FIG. 3a, and which is designed as a round magnet, in the direction of one of its areas of coverage. FIG. 3b shows the distribution of the magnetic field strength H over an area which is spanned by the spatial coordinates X and Y, and which lies parallel to the area of coverage of the main magnet 4. Preferably, a main magnet 4 is used, the magnetic field F of which comprises extremes E1, E2 on the circumferences of an extreme value circle 10, which has the same diameter as the imaginary circle 9, on the circumference of which the magnetic field sensors 6.1 to 6.4 are arranged. FIG. 3c shows a graph of the magnetic field strength H on a point of the circumference of the extreme value circle 10, depending on an angular position of the main magnet 4 which is described by a rotational angle α.

FIGS. 4a and 4b each show a schematic top view of four magnetic field sensors 6.1 to 6.4 and a main magnet 4 in two different angular positions. In FIG. 4a, the north pole N of the main magnet points in the direction of the magnetic field sensor 6.1, the south pole accordingly points in the opposite direction towards the magnetic field sensor 6.3. The two remaining magnetic field sensors 6.2, 6.4 each lie in a range in which the magnetic field F, as shown in the zero points of the graph in FIG. 3c, has no vertical component. The angular position of the main magnet 4 can therefore be determined solely on the basis of the polarity of the magnetic field F measured by the magnetic field sensors 6.1 to 6.4. Field lines of the magnetic field F which emerge from the drawing in the direction of the observer are in accordance with convention marked by a dot in a circle, while field lines which run in the opposite direction are marked with a cross in a circle, and are shown as examples alongside the individual magnetic field sensors 6.1 to 6.4. An empty circle signifies the absence of a magnetic field. In FIG. 4b, the main magnet 4 is rotated by 45° in a counter clockwise direction as a result of which the magnetic field sensors 6.1 to 6.4 measure a magnetic field F with the opposite polarity to the field which is detected by the magnetic field sensors 6.2 and 6.3. In this manner, only eight angular positions of the main magnet 4 can be differentiated, taking into account the polarity of the magnetic field F measured on each of the magnetic field sensors 6.1 to 6.4. If a sufficiently precise value of the magnetic field strength H is determined by each of the magnetic field sensors 6.1 to 6.4, a correspondingly precise determination of the angular position, as well as of the distance between the main magnet 4 and the magnetic field sensors 6.1 to 6.4, i.e. its axial position, is possible.

FIGS. 5a and 5b each show a schematic side cross-section view of the arrangement from FIG. 4, with the main magnet 4 in two different axial positions. Accordingly, only two magnetic field sensors 6.1 and 6.3 are visible. In FIG. 5a, the main magnet 4 is located in an axial position which is at a greater distance from the magnetic field sensors 6.1, 6.3; in FIG. 5b, it is in an axial position which is closer to the magnetic field sensors 6.1, 6.3. In both cases, the polarity of the magnetic field F determined by the magnetic field sensors 6.1, 6.3 remains unchanged, although with the situation shown in FIG. 5b, the magnetic field strength H measured in each case is greater than in the situation shown in FIG. 5a, which is clarified by the greater number of field lines which run through the magnetic field sensors 6.1, 6.3. With this type of determination of the axial position, the main magnet 4 can be directly affixed to the rotor 2 without requiring an auxiliary rotor 3 with connecting member 8.

FIG. 6 shows a schematic side view of an integrated circuit 5 with magnetic field sensors 6 which is arranged on a printed circuit board 11 on its side which faces away from the main magnet 4. This embodiment can be selected if the structure of an arrangement such as that shown previously in FIGS. 1, 4 and 5 should be made difficult or impossible. The damping of the magnetic field F by the printed circuit board 11 and its circuit paths and areas is to be offset by making the main magnet 4 correspondingly stronger. The angular position detected by the magnetic field sensors 6.1 to 6.4 has an inverse direction of rotation.

FIG. 7a shows a schematic side view of a further embodiment of a contactless switch 1, in which the main magnet 4 which is arranged on an auxiliary axis 12 parallel to a rotational axis 13 of the rotor 2 is driven with the aid of two cog wheels 14.1, 14.2. Instead of the cog wheels 14.1, 14.2, another type of gear is possible, such as another type of cog wheel, angle drive, control chain or drive belt. Just as in FIG. 6, the direction of rotation of the angular position change of the rotor 2 detected by the magnetic field sensors 6.1 to 6.4 which are arranged in the integrated circuit 5 is inverted in relation to said rotor. In the drawing shown, an infrared transceiver 15 is located in the extension of the rotational axis 13 on the printed circuit board 11 in order to communicate with a corresponding counter-piece (not shown) which is provided in the key, as it can be used for identifying the key 7, for example with ignition locks. The rotor here comprises a bore hole in the area of its rotational axis 13. Naturally, the arrangement shown can also be realised without the infrared transceiver 15. FIG. 7b shows the contactless switch from FIG. 7a in a top view. The cog wheel 14.2 is transparent in the drawing in order to make visible the integrated circuit 5.

FIG. 8a shows a schematic side view of a contactless switch 1, the structure of which essentially corresponds to that shown in FIGS. 7a and 7b. The transfer of the rotational movement between the rotational axis 13 and the auxiliary axis 12 is here not achieved by cog wheels, however, but rather by an auxiliary magnet 16, which is also diametrically polarised, but designed as a ring magnet. Since the opposite pole pairs of the main magnet 4 and the auxiliary magnet 16 attract each other, a rotational movement of the rotor 2 with the auxiliary magnet 16 in turn also causes the main magnet 4 to rotate in the opposite direction around the auxiliary axis 12.

FIG. 9 shows a schematic side view of a further embodiment of a contactless switch 1, in which the main magnet 4 is rotatably arranged around an auxiliary axis 12, which is aligned with the rotational axis 13 of the rotor 2. On the rotor 2 an auxiliary magnet 16 is rotatably arranged around the rotation axis 13, the magnetic field of which drives the main magnet 4. This embodiment also enables the use of an infrared transceiver 15 for communicating with the key 7, insofar as the main magnet 4 is designed as a ring magnet.

FIG. 10 shows a block diagram of a signal transmission between the integrated circuit 5 and a microprocessor 17 with wake-up function. The integrated circuit 5 evaluates the measured values of the magnetic field sensors 6.1 to 6.4, and transfers the determined angular and/or axial position of the rotor 2 in the form of a continuous signal A1 and a discreet signal D1. For this purpose, the existing continuous A1 signal must be quantised in the integrated circuit 5, for example by means of an analogue/digital converter. The discreet signal D1 can for example be issued as pulse width coded and/or serially and/or parallel. The information from the two signals A1 and D1 is essentially redundant. In this manner, greater security against interference and/or system failure is possible. The microprocessor 17, which is designed as a microcontroller for example, has inputs which are suitable for receiving the signals A1 and D1. For the continuous signal A1, an analogue/digital converter must be integrated in the microprocessor 17. A further discreet signal D2 is only activated by the integrated circuit 5 when a position change has occurred. It can be used in order to wake the microprocessor 17 from its power save mode. This function is referred to as the wake-up function.

Figure 11:
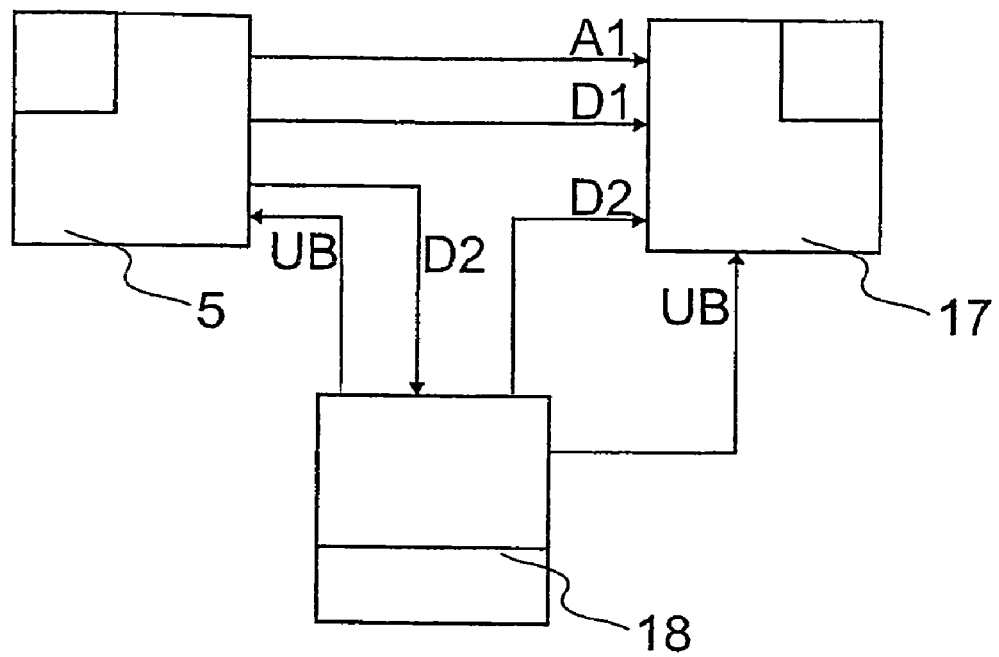
FIG. 11 shows a block diagram of a signal transmission between the integrated circuit and a microprocessor with wake-up function, involving a system basis chip.

FIG. 11 shows a block diagram of a signal transmission between the integrated circuit 5 and a microprocessor 17 with wake-up function, with the involvement of a system basis chip 18. The system basis chip 18 is an integrated circuit for standard functions such as voltage supply and regulation. The arrangement in FIG. 10 is supplemented by the fact that both the integrated circuit 5 and the microprocessor 17 are supplied by the system basis chip 18 with an operational voltage UB, and the application of the operational voltage UB to the microprocessor 17 is triggered by the discreet signal D2 which executes the wake-up function. The microprocessor 17 accordingly only requires power when a position change of the contactless switch 1 has occurred. It is also possible to operate the microprocessor 17 e.g. in power down mode and/or sleep mode, and to re-awaken it with the signal D2. The microprocessor 17 has a reduced power intake in these special operational states.

Figure 12:
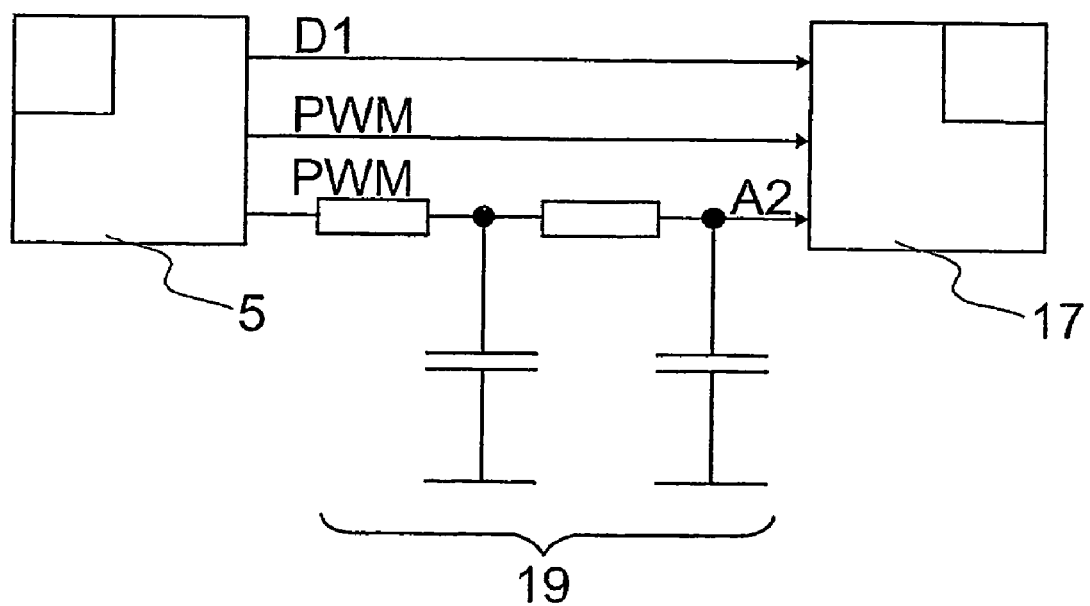
FIG. 12 shows a block diagram of a signal transmission between the integrated circuit and a microprocessor with redundancy

FIG. 12 shows a block diagram of a redundant signal transmission between the integrated circuit 5 and a microprocessor 17. In this exemplary embodiment, the position information is transferred in three different ways from the integrated circuit 5 to the microprocessor 17. As well as the already known discreet signal D1, a pulse width coded signal PWM is generated in the integrated circuit, which on the one hand is received directly by the microprocessor 17, where the position information is reconstructed by measuring the pulse widths. On the other hand, the pulse width coded signal PWM is integrated by a low pass 19, e.g. of the second degree. As a result, with an integrated circuit, a pulse width modulated output PWM can be converted into an analogue signal A2 by means of an external low pass 19 without a separate analogue output. The continuous signal or analogue signal A2 which results during this process is in turn quantised in the microprocessor by an analogue/digital converter which is integrated there.

The contactless switch 1 is suitable for example as an electronic ignition lock, as a light switch or to record a steering angle or regulate an air conditioning system.

The determination of the axial position shown in FIGS. 5a and 5b can be combined with a connecting member 8, as shown in FIG. 1.

Instead of a connecting member 8, another type of conversion of an axial movement into an angular movement is possible, for example by means of a thread.

Other magnets can be used as a main magnet 4 instead of round or ring magnets, in particular those with a polarisation which deviates from the diametrical polarisation.

Other magnetic field sensors 6.1 to 6.n can be used instead of Hall sensors. In particular, the magnetic field sensors 6.1 to 6.n do not have to be integrated in an integrated circuit 5. They also do not have to be four in number.

Alternatively, the rotor 2 can be designed as stationary, and a slide which is not shown in greater detail can be moved.

Here, the rotor 2 comprises an axial slit in such an exemplary embodiment, while the auxiliary rotor 3 comprises a connecting member and the slide comprises e.g. two pins on its side.

Preferably, the contactless switch 1 described above is used as an electronic ignition lock or as a light switch, or to record a steering angle or regulate an air conditioning system. Furthermore, the contactless switch 1 can be used for further alternative functions or applications, systems or devices.

LIST OF REFERENCE NUMERALS

1 Contactless switch
2 Rotor
3 Auxiliary rotor
4 Main magnet
5 Integrated circuit
6 Magnetic field sensor
7 Key
8 Connecting member
9 Imaginary circle
10 Extreme value circle
11 Printed circuit board
12 Auxiliary axis
13 Rotational axis
14 Cog wheel
15 Infrared transceiver
16 Auxiliary magnet
17 Microprocessor
18 System basis chip
19 Low pass
A1, A2 Continuous signal
D1, D2 Discreet signal
α Rotational angle
E Extreme of the magnetic field
F Magnetic field
H Magnetic field strength
N North pole
PWM Pulse width modulated signal
S South pole
X, Y Spatial coordinates

The invention claimed is:

1. A contactless switch comprising
   a) an angularly and/or axially adjustable rotor with a key retention device at a first axial end of the rotor, wherein the rotor is rotatable around a rotational axis,
   b) at least two magnetic field sensors,
   c) at least one main magnet which is rotatable around an auxiliary axis, wherein the at least one main magnet is arranged so that a magnetic field of the at least one main magnet influences the at least two magnetic field sensors, and wherein, due to the influencing by the magnetic field, the magnetic field sensors are adapted to issue signals which correlate with a magnetic field strength of the magnetic field and/or a change of the magnetic field strength and/or a polarization of the magnetic field,
   d) an infrared transceiver arranged centered on the rotational axis and adjacent to a second axial end of the rotor opposite the first axial end, and
   e) a connecting element comprising at least one gear and/or at least one auxiliary magnet between the rotor and the main magnet, wherein the contactless switch is adapted to displace the main magnet by the rotor via the connecting element.

2. The contactless switch according to claim 1, characterized in that the connecting element comprises the at least one auxiliary magnet which is rotatably supported around the rotational axis of the rotor and is configured as a ring magnet.

3. The contactless switch according to claim 2, characterized in that the magnetic field sensors face toward the main magnet which is arranged on the auxiliary axis, the main magnet is movable by the at least one auxiliary magnet which is rotatable around the rotational axis, and the rotational axis and the auxiliary axis are in alignment with one another.

4. The contactless switch according to claim 1, characterized in that four of the magnetic field sensors are provided, and are arranged offset from each other by 90° on a circumference of an imaginary circle.

5. The contactless switch according to claim 4, characterized in that the main magnet is centered over a central point of the imaginary circle, and an angular position of the rotor can be determined by the polarization and/or the magnetic field strength of the magnetic field of the main magnet on at least two of the magnetic field sensors.

6. The contactless switch according to claim 4, characterized in that at least two of the magnetic field sensors are integrated in an integrated circuit.

7. The contactless switch according to claim 1, characterized in that the rotor is a main rotor, which is arranged coaxially in an auxiliary rotor, wherein the main rotor and the auxiliary rotor are angularly and/or axially adjustable relative to each other, wherein the main rotor and the auxiliary rotor comprise a thread or connecting member which interlock with each other, with which an axial displacement of the main rotor effects an angular adjustment of the auxiliary rotor, and wherein the auxiliary rotor serves as a connecting element for the indirect connection of the main magnet to the main rotor.

8. The contactless switch according to claim 1, characterized in that the rotor is axially movable in a direction along the rotational axis together with a rotational movement around the rotational axis.

9. The contactless switch according to claim 1, characterized in that the signals can be issued pulse width coded and/or serially and/or parallel relative to one another.

10. A contactless switch comprising
a) an angularly and/or axially adjustable rotor with a key retention device at a first axial end of the rotor, wherein the rotor is rotatable around a rotational axis,
b) at least two magnetic field sensors,
c) at least one main magnet which is rotatable around an auxiliary axis, wherein the at least one main magnet is arranged so that a magnetic field of the at least one main magnet influences the magnetic field sensors, and wherein, due to the influencing by the magnetic field, the magnetic field sensors are adapted to issue signals which correlate with at least one of a magnetic field strength of the magnetic field, a change of the magnetic field strength, and a polarization of the magnetic field,
d) an infrared transceiver arranged centrally to the rotational axis and adjacent to a second axial end of the rotor opposite the first axial end, and
e) a connecting element comprising at least one of a gear and an auxiliary magnet between the rotor and the main magnet, wherein the contactless switch is adapted to displace the main magnet by a displacement of the rotor acting through the connecting element, and
wherein the gear or the auxiliary magnet is rotatably supported around the rotational axis of the rotor and is configured respectively as a gear with a central hole or a ring magnet.

11. The contactless switch according to claim 10, wherein the magnetic field sensors face toward the main magnet which is affixed on the auxiliary axis, the connecting element comprises the auxiliary magnet, the main magnet is movable by movement of the auxiliary magnet which is rotatable around the rotational axis, and the rotational axis and the auxiliary axis are in alignment with one another.

12. A contactless switch arrangement activatable by a key, said switch arrangement comprising:
a rotor that is rotatable by at least a partial rotation about a rotor axis, and that has first and second ends axially opposite one another along said rotor axis, with a key receiver adapted to receive the key at said first end of said rotor;
a main magnet that is rotatable by at least a partial rotation about a magnet axis which is parallel to and offset from said rotor axis, wherein said main magnet is located radially beside said second end of said rotor, and wherein said main magnet is rotationally coupled to said rotor for mutual rotational movement of said main magnet with rotational movement of said rotor in that a first gear is secured to said second end of said rotor, a second gear is secured to said main magnet, and said first and second gears intermesh with one another, or in that an auxiliary magnet is secured to said second end of said rotor and magnetically coupled with said main magnet;
two magnetic field sensors stationarily arranged and adapted to sense a magnetic field of said main magnet; and
an infrared transceiver arranged adjacent to said second end of said rotor.

13. The contactless switch arrangement according to claim 12, wherein said rotor includes a first rotor part at said first end and a second rotor part at said second end, said first and second rotor parts are relatively axially displaceable along said rotor axis and relatively rotatable about said rotor axis relative to one another, one of said rotor parts is coaxially received at least partially in another of said rotor parts, and said first and second rotor parts are mechanically linked to one another by a mechanical connection such that relative axial displacement is linked to relative angular rotation of said first and second rotor parts relative to one another.

14. The contactless switch arrangement according to claim 12, wherein a hole extends axially through said rotor from said key receiver to said second end to enable an infrared communication through said hole between said infrared transceiver and the key received by said key receiver.

15. The contactless switch arrangement according to claim 12, wherein said infrared transceiver is spaced axially from and faces toward said second end of said rotor, and said infrared transceiver is stationarily arranged coaxially centered on and intersected by an axial extension of said rotor axis beyond said second end of said rotor.

16. The contactless switch arrangement according to claim 12, wherein said main magnet is rotationally coupled to said rotor in that said first gear is secured to said second end of said rotor, said second gear is secured to said main magnet, and said first and second gears intermesh with one another.

17. The contactless switch arrangement according to claim 12, wherein said main magnet is rotationally coupled to said rotor in that said auxiliary magnet is secured to said second end of said rotor and magnetically coupled with said main magnet.

18. The contactless switch arrangement according to claim 12, wherein said auxiliary magnet is a ring-shaped auxiliary magnet.

19. A contactless switch comprising
a) an angularly and/or axially adjustable rotor with a key retention device, wherein the rotor is rotatable around a rotational axis,
b) at least two magnetic field sensors, c) at least one main magnet which is arranged to be rotatable around an auxiliary axis with the magnetic field sensors facing toward the at least one main magnet, wherein the at least one main magnet is arranged so that a magnetic field of the at least one main magnet influences the magnetic field sensors, and wherein, due to the influencing by the magnetic field, the magnetic field sensors are adapted to issue signals which correlate with at least one of a magnetic field strength of the magnetic field, a change of the magnetic field strength, and a polarization of the magnetic field, d) an infrared transceiver arranged centrally to the rotational axis and in the immediate vicinity of the rotor, and e) a connecting element comprising an auxiliary magnet between the rotor and the main magnet, wherein the contactless switch is adapted to displace the main magnet by a displacement of the rotor acting through the connecting element in that the main magnet is movable by movement of the auxiliary magnet which is rotatable around the rotational axis, and wherein the auxiliary magnet is rotatably supported around the rotational axis of the rotor and is configured as a ring magnet, and the rotational axis and the auxiliary axis are in alignment with one another.

\* \* \* \* \*